United States Patent [19]

Hunsinger et al.

[11] Patent Number: 5,440,155
[45] Date of Patent: Aug. 8, 1995

[54] ACOUSTIC CHARGE TRANSPORT CONVOLVER, METHOD OF USE AND FABRICATION

[75] Inventors: Billy J. Hunsinger; Frederick M. Fliegel, both of Urbana, Ill.

[73] Assignee: Electronic Decisions Incorporated, Urbana, Ill.

[21] Appl. No.: 108,602

[22] Filed: Oct. 15, 1987

[51] Int. Cl.[6] .................. H01L 29/796; H01L 27/20
[52] U.S. Cl. .................... 257/241; 257/222; 257/249; 257/416
[58] Field of Search .................. 357/26, 15, 24; 310/313 R, 313 A, 313 B; 333/193–195; 257/222, 249, 416, 241

[56] References Cited

U.S. PATENT DOCUMENTS

| | | | |
|---|---|---|---|
| 3,737,785 | 6/1973 | Korpel | 325/442 |
| 3,760,172 | 9/1973 | Qunte | 235/181 |
| 3,770,949 | 11/1973 | Whitehouse et al. | 235/181 |
| 3,975,696 | 8/1976 | Kantorowicz | 333/30 R |
| 4,017,751 | 4/1977 | Desormiere et al. | 310/8.1 |
| 4,037,174 | 7/1977 | Moore et al. | 333/30 R |
| 4,041,419 | 8/1977 | Desormiere et al. | 333/30 R |
| 4,058,745 | 11/1977 | Otto | 310/366 |
| 4,101,965 | 7/1978 | Ingebrigtsen et al. | 364/821 |
| 4,247,903 | 1/1981 | Grudkowski et al. | 364/821 |
| 4,388,599 | 6/1983 | Gautier et al. | 333/150 |
| 4,473,888 | 9/1984 | Smith | 364/821 |
| 4,485,363 | 11/1984 | Hunsinger et al. | 333/193 |
| 4,633,285 | 12/1986 | Hunsinger et al. | 357/26 |

OTHER PUBLICATIONS

J. P. Parekh et al, Convolution with Magnetostatic Waves in YIG Films, Sep. 1985, pp. 690–696, IEEE Transactions on Sonics and Ultrasonics vol. SU-32 No. 5.

E. L. Adler, Spatial Uniformity and Broadband Matching in Multiply Tapped SAW Convolvers, Sep. 1985, pp. 685–689, IEEE Transactions on Sonics and Ultrasonics, vol. SU-32, No. 5.

H. P. Grassl et al, Small-Aperture Focusing Chirp Transducers vs. Diffraction–Compensated Beam Compressors in Elastic SAW Convolvers, IEEE Transactions on Sonics and Ultrasonics, vol. SU-32, No. 5, Sep. 1985, pp. 675–684.

S. Minagawa et al, Efficient ZnO-SiO$_2$-Si Sezawa Wave Convolver, IEEE Transactions on Sonics and Ultrasonics, vol. SU-32, No. 5, Sep. 1985, pp. 670–674.

M. E. Motamedi et al, Large-Scale Monolithic SAW Convolver/Correlator on Silicon, IEEE Transactions on Sonics and Ultrasonics, vol. SU-32, No. 5, Sep. 1985, pp. 663–669.

W. Wang et al, Acoustoelectric Interactions in Thin–Film Semiconductors Induced by Two Contra-Directed Surface Acoustic Waves, IEEE Transactions on Sonic and Ultrasonics, vol. SU-32, No. 5, Sep. 1985, pp. 645–662.

M. J. Hoskins et al, Recent Developments in Acoustic Charge Transport Devices, 1986 IEEE Symposium.

R. A. Becker et al, Wide-Band Monolithic Acoustoelectric Memory Correlators, IEEE Transactions on Sonics and Ultrasonics, vol. SU-29, No. 6, Nov. 1982, pp. 289–298.

Primary Examiner—John B. Sotomayor
Attorney, Agent, or Firm—Joseph W. Berenato, III

[57] ABSTRACT

A convolver includes first and second buried channels, with each of the channels comprised of a piezoelectric semiconductor. The input of one channel is associated with the output of the other channel. An acoustic transducer is positioned adjacent each input for generating an acoustic wave which propagates through the associated channels and thereby transports charge from the input to the output thereof. A non-destructive sensing array overlies the channels and samples the charge transported thereunder. The array includes an assembly for summing the sampled charge and for generating a product. An electrode is operably associated with the summing assembly for integrating the products and generating a convolution signal.

38 Claims, 5 Drawing Sheets

ACOUSTIC CHARGE TRANSPORT CONVOLVER, METHOD OF USE AND FABRICATION

GOVERNMENT SUPPORT

This invention was made with government support under contract number F-30602-84-C-0126 awarded by the Department of Defense. The government may have certain rights in this invention.

BACKGROUND OF THE INVENTION

Signal convolution involves the detection of one or more particular characteristics of a signal, or combination of signals, in such a way that a particular characteristic of interest is reinforced or supressed. Convolution is one mechanism for permitting received signals to be interpreted with regard to a known reference signal, such as may be useful with radar, sonar and other similar systems. Convolution requires the storage of two signals over the sampling time, point by point multiplication of the signals and integration of the associated products.

Surface acoustic wave technology has been used to practice convolution, although these prior devices have had a number of drawbacks relating to propagation of the signals along the substrate surface. Furthermore, the signals were launched through a common delay line, thereby permitting "self-convolution" to occur due to signal reflection from one transducer or the other. Self-convolution is not desirable because the resulting output signal depends on only one input signal, rather than being produced when both input signals are non-zero.

Surface acoustic wave signals in the prior devices were extracted from the original signal source, thereby reducing the available energy for signal transport. Signal strength degrades per unit length, so that the devices had a finite useable length, which length limited the length of the coded signal which could be interpreted. Cascading of devices was not possible because of the signal degeneration.

From the above, it can be seen that there is a need for a convolver which overcomes the drawbacks of the prior art surface acoustic wave convolution devices. The disclosed invention is just such a convolver and avoids "self-convolution" by utilizing separate delay line channels, permits longer channel lengths to be utilized because the signal transport energy is not diminished by sampling, and also permits cascading of convolvers to permit longer length coding sequences to be interpreted.

OBJECTS AND SUMMARY OF THE INVENTION

The primary object of the disclosed invention is a convolver, method for use and for fabrication which overcomes the drawbacks of the prior art convolution devices and methods, and one which permits relatively long coded signal inputs to be interpreted, while achieving insertion loss and maximum time bandwidth products which are not limited by acoustic losses of the signal stored in each delay line.

A convolver according to the invention comprises first and second buried channels, with each channel comprised of a piezoelectric semiconductor. Each channel has an input and an output, and the input of one channel is laterally aligned with the output of the other channel. A transducer is operably associated with each of the inputs and generates acoustic waves which propagate through the associated channel and transport injected charge from the associated inputs to the outputs thereof. A non-destructive sensing system comprising a plurality of longitudinally spaced conductive fingers overlies each channel and samples the charge transported thereunder. Schottky barrier diodes sum the sampled charges and generate products related thereto. The Schottky barrier diodes are coupled to an output electrode which integrates the products and generates the convolution signal which is then transmitted to a load.

The generation of a convolution signal comprises providing first and second buried channels, with each channel comprised of a piezoelectric semiconductor and with the input of one channel being laterally aligned with the output of the other channel. A surface acoustic wave is propagated through each channel and transports injected charge from the associated inputs to the associated outputs. One of the inputs is connected to a known signal source, and the other of the inputs is connected to an unknown source. The charge is repeatedly sampled by non-destructive sensing systems spaced along each channel. A plurality of products are generated by mixing the charge sampled with each sampling means of one channel with the charge sampled with an associated sampling means of the other channel. The convolution signal is generated by integration of the products.

The convolver of the invention is fabricated by causing selected portions of a piezoelectric semiconductor substrate to become electrically insulating for thereby defining at least a pair of spaced parallel channels, with each channel being bordered by the insulating portions and with each channel being generally rectangular and having first and second end portions. Each channel has an input and an output, and the input of one channel is aligned with the output of the other channel. An acoustic transducer is positioned on the substrate in alignment with each input for permitting an acoustic wave to propagate through the related channels. The channels are overlayed with a plurality of integral spaced parallel non-destructive conductive sensing means which extend generally transverse to the channels, and with each sensing means including a non-linear element at an end portion thereof. An integrating means, such as an electrode, is positioned on the substrate adjacent to the non-linear elements and in close proximity thereto.

These and other objects and advantages of the invention will be readily apparent in view of the following description and drawings of the above described invention.

DESCRIPTION OF THE DRAWINGS

The above and other objects and advantages and novel features of the present invention will become apparent from the following detailed description of the preferred embodiment of the invention illustrated in the accompanying drawings, wherein.

DESCRIPTION OF THE INVENTION

Figure 1:
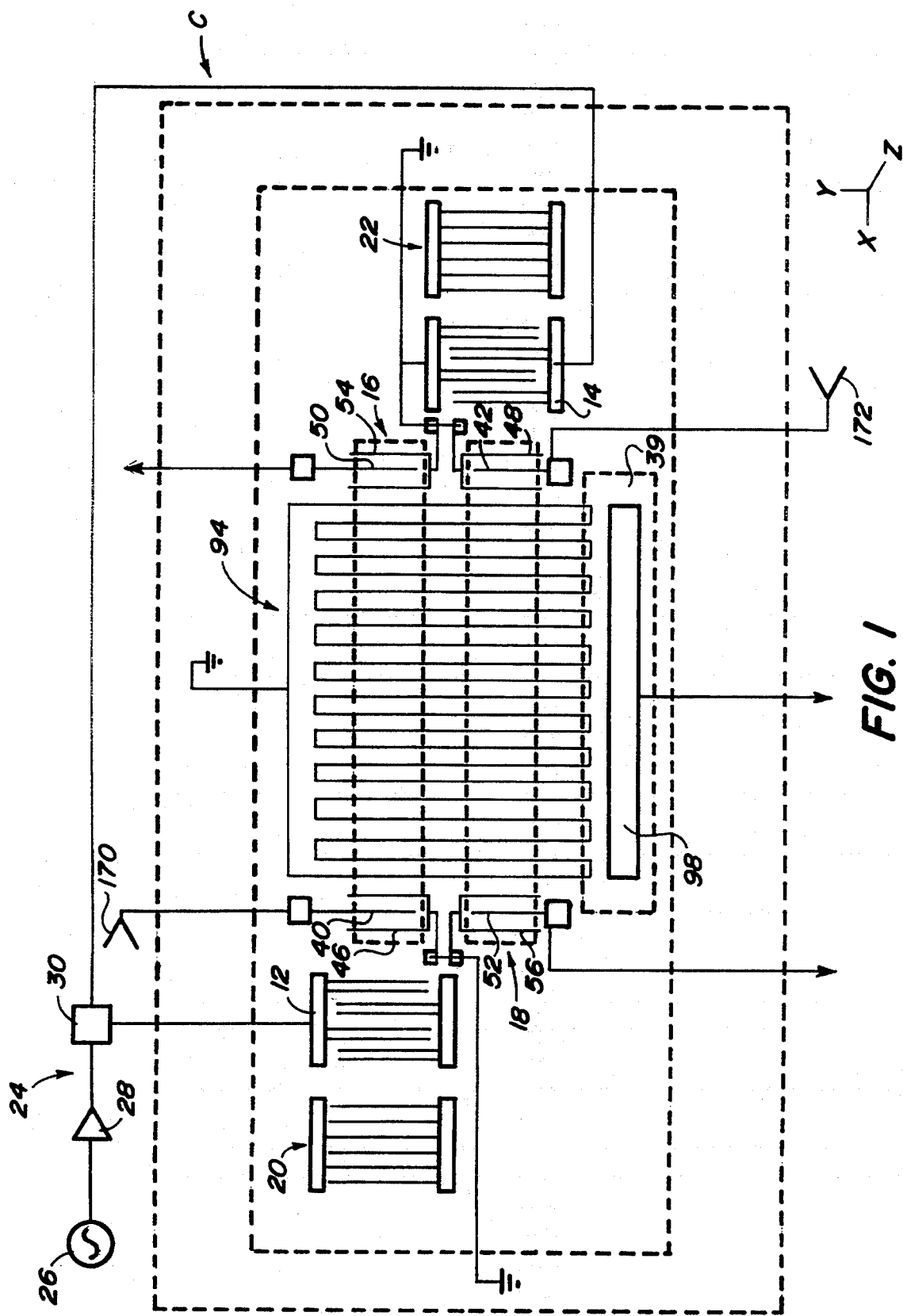
FIG. 1 is a plan view, partially in schematic, illustrating a convolver constructed according to the invention.

An acoustic charge transport device is a semiconductor device in which a surface acoustic wave propagates within a defined buried channel in the piezoelectric semiconductor substrate and which transports injected charge between the input and the output of the device. An exemplary acoustic charge transport device is disclosed in U.S. Pat. No. 4,633,285, issued Dec. 30, 1986 to Hunsinger, et al for Acoustic Charge Transport Device and Method, the disclosure of which is incorporated herein by reference.

Convolution of two input signals to provide an output signal pursuant to the invention involves the storage of the two input signals, each in its own unique acoustic charge transport traveling wave delay line. Repeated non-destructive sensing of time domain samples of each of the signals in the delay lines occurs through a non-destructive sense electrode system. The temporal signal samples of the devices are mixed (multiplied) to generate the mathematical product of each of the non-destructive sense electrode signal sample pairs. This is accomplished by applying the sum of each signal sample pair to a square law non-linear element in the non-linear interaction region. Weighted or unweighted integration (summation) of the cross-product and self-product signals generated by the non-linear elements to obtain the desired convolution (cross-products) and to suppress undesired signals and mixing products (self-products) is accomplished by the output electrode which is advantageously positioned adjacent to the non-linear elements.

The disclosed convolver forms the convolution of two input wave forms by propagating signals in opposite directions within two adjacent acoustic charge transport delay lines. The signals in both delay lines are sampled, and the sum of each sample pair is fed into a nonlinear element. This forms the point by point product of the two wave forms, and the point by point products are integrated along the delay line length by the output contact in order to provide the convolution of the two input wave forms.

The point by point products of the delay line signals are derived from the nonlinear elements. The transfer characteristic of the nonlinear elements can be expressed as:

$$V_{out} = A_1 V_{IN} + A_2 V_{IN}^2 + A_3 V_{IN}^3 + \text{(higher order terms)}$$

The second term on the right hand side of this expression is the term which gives rise to the desired point by point products. The $V_{IN}$ variable, as used here, represents the point by point sum of the signals from each of the two delay lines. Substituting the sum of the signal samples for the $V_{IN}$ variable and expanding the second term only, we find:

$$V_{out} = A_2(V_{IN1}^2 + V_{IN2}^2 + 2 V_{IN1} V_{IN2})$$

The subscripts IN1 and IN2 refer to the signals from each of the respective delay lines. The last term in the brackets on the right hand side of the equation represents the point by point product which is the essential key to forming the convolution of the input signals.

Convolution of a signal waveform, $f_S$, with a reference waveform, $f_R$, to provide the waveform $V_{out}$, can be mathematically described as:

$$V_{OUT} = \int_0^t f_S(\tau) f_R(T - \tau) d\tau$$

In the disclosed invention, the signal $f_S$ is taken as propagating in the $+x$ direction at the sound velocity, $v_S$. It is thus expressed as $f_S(t - x/v_S)$. The signal $f_R$ is propagating in the opposition direction, and is expressed as $f_R(t - (L - x)/v_s)$, L is the length of the delay line. The output signal is thus of the form:

$$V_{OUT} = \int_0^L f_S(\tau - X/v_S) f_R(\tau - (L - x)/v_S) dx$$

Substituting $\tau = t - x/v_S$ and $T = L/v_S$, where T is the time length of the device, the output signal is expressed as:

$$V_{OUT} = \int_0^T f_S(\tau) f_R(2\tau - \tau - T) v_S d\tau$$

This expression is of the form of a convolution integral, with the time scale of the result compressed by a factor of two. This expression describes the desired output signal of the convolver of the invention as a function of the two input signals.

Figure 5:
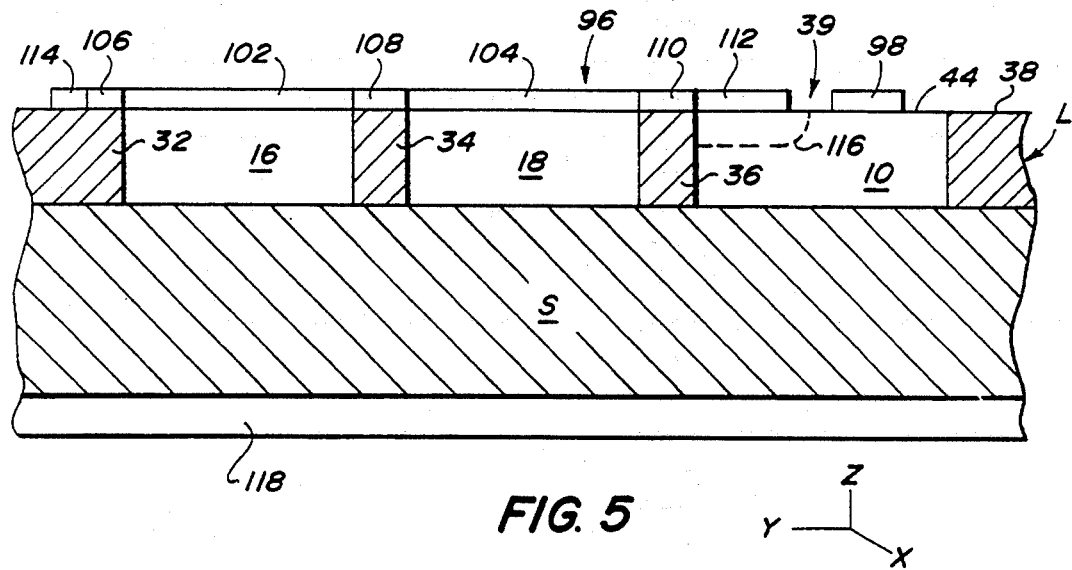
FIG. 5 is a fragmentary cross-sectional view of a convolver constructed according to the invention.

A single crystalline piezoelectric semiconductor substrate S, comprised of gallium arsenide, supports the epitaxial layer L upon and in which the device features are fabricated, as best shown in FIGS. 1 and 5. The substrate material S is typically on the order of 375 μm in thickness, and thicker substrates generally require unacceptably large backgate voltages. Thinner substrates, on the other hand, are difficult to handle because of the possibility of fracture.

The substrate S material is oriented so that the top surface 10 is a 100 surface, to within a few degrees. The vertical and horizontal directions of FIG. 1 are 110 directions in the crystal. The device structures should be aligned to the 110 direction as closely as possible, preferably to at least one-half degree. Small misalignment may result in acoustic beam steering.

The substrate S material should be of the highest resistivity available, typically $10^7 \Omega$-cm or greater. This is required for acceptable surface acoustic wave transduction, as well as proper backgating behavior in the delay line channels.

Surface acoustic wave transducers 12 and 14 are employed for surface acoustic wave transduction. Typically, the transducers 12 and 14 are each comprised of an interdigitated grid of metal strips interconnected as illustrated in FIG. 1. The "split finger" configuration is preferred for efficient surface acoustic wave generation.

Typically, the individual metal strips of the grids of the transducers 12 and 14 consist of about 2000 angstroms of aluminum doped with copper, with a copper concentration of 1%–5%. The aluminum is disposed atop a layer of chromium or titanium, usually of a thickness of 100 angstroms. Aluminum is employed to minimize the metal resistivity and to increase transducer efficiency in converting electrical energy to electromechanical energy. The copper is added to the aluminum to minimize electrical and mechanical migration of the transducer metal, which could cause fatigue after a relatively short period of service. The thin chromium or titanium layer is utilized as an adhesion promoting agent, and as a metalurgical barrier for the copper in the aluminum. Copper is well known therefore degrading the semiconductor properties of gallium arsenide.

Typically, the transducer 12 and 14 fingers are one $\mu$m wide, and are separated by one $\mu$m gaps. The fingers are chosen to have a length and a region of overlap which are consistent with the delay line dimensions. The objective is to insure that the transport channels 16 and 18 are uniformly illuminated by the surface acoustic waves over the entire extent of each channel 16 and 18.

Acoustic reflectors 20 and 22 are disposed proximate the transducers 12 and 14, respectively. The reflectors 20 and 22 are not essential for convolver operation, but they increase transducer efficiency by reflecting acoustic energy back into the associated channel. Should reflectors not be utilized, then an acoustic absorber material should be placed in an appropriate location so as to disperse the reverse propagating wave.

The transducers 12 and 14 are excited by drive system 24. The drive system 24 typically involves a source 26, an amplifier 28 and related assemblies, including a distribution mechanism 30 which feeds the transducers 12 and 14.

Figure 6:
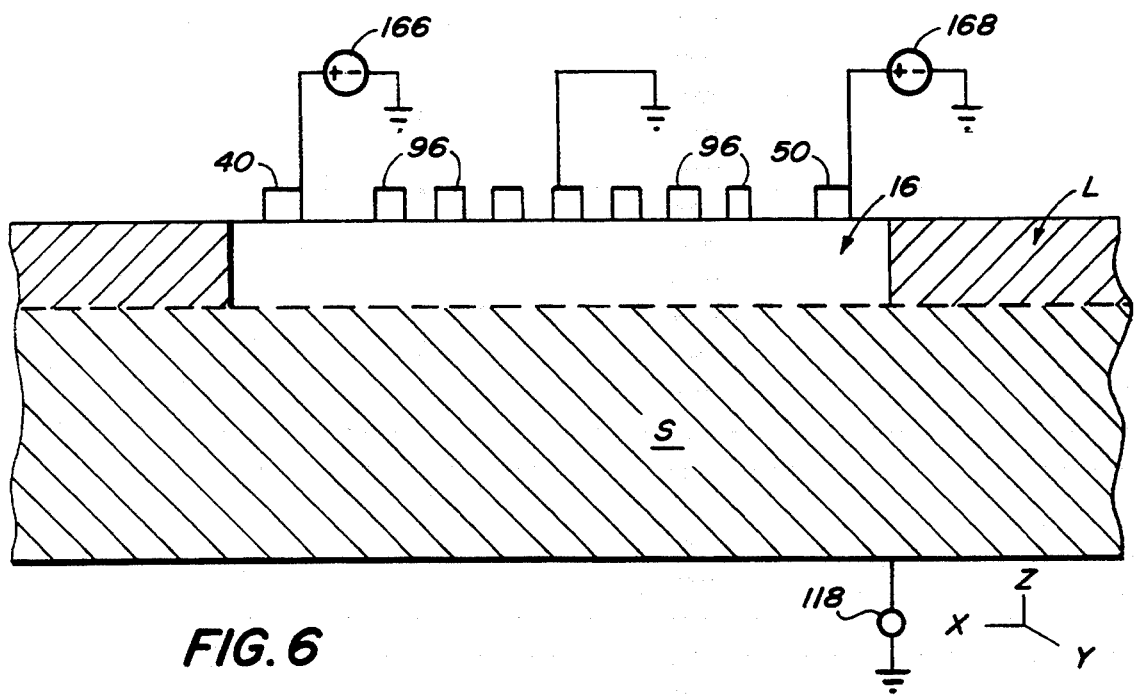
FIG. 6 is a fragmentary longitudinal cross-sectional view, partly in schematic, of a convolver according to the invention.

The transport channels 16 and 18 are isolated electrically in the Z direction of FIG. 6 by the semi-insulating substrate material S. They are laterally electrically isolated, as best shown in FIG. 5, from the remainder of the structure by proton bombardment of the epitaxial layer L. Proton bombardment of the epitaxial layer L alters the layer L resistivity, rendering the bombarded portions 32, 34, 36 and 38 semi-insulating. The channels 16 and 18 and the moat 39, as best shown in FIGS. 1 and 5, are protected from proton bombardment by a suitable mask layer which is removed subsequent to the bombardment process.

Proton bombardment, as those skilled in the art will understand, is a process whereby high energy protons alter the electrical resistivity of a semiconductor substrate. Typical bombardment energies and proton doses are 600 Kev and $10^{14}/cm^2$, respectively. Naturally, these quantities can vary significantly, depending, among other considerations, upon the epitaxial material.

Typically, the channels 16 and 18 are 400$\mu$ wide and 2864$\mu$ long. This length equates to 1 microsecond of delay at the surface acoustic wave velocity. The width and length can vary significantly from these dimensions, although the other features must likewise be varied accordingly. The upper limit on the length is set by the loss and diffraction properties of the surface acoustic waves as they propagate through the associated channels.

Each of the channels 16 and 18 has an input contact 40 and 42, respectively. The input contacts 40 and 42 are, typically, a strip of metal disposed across the surface 44 of the layer L. The input contacts 40 and 42 make ohmic contact to the n-type semiconductor epitaxial layer L of the channels.

Typically, the contacts 40 and 42 consist of a few hundred angstroms of a gold germanium eutectic alloy which has been alloyed to the semiconductor epitaxial layer L by heat treatment. The contact length is typically 4 $\mu$m, while the contact width is approximately the same as that of the related channel. The contacts 40 and 42 are normally spaced from other device elements by a gap of at least 1 $\mu$m.

Input gates 46 and 48 are not essential for proper convolver operation. The input gates 46 and 48 provide a greater degree of flexibility in optimizing the bias voltages employed. The gate contact length is typically 1 $\mu$m, while the contact width is approximately the same as that of the related channel. As noted, the contacts of the gates 46 and 48 are typically spaced from the neighboring device elements by a gap of at least 1 $\mu$m.

The output contacts 50 and 52 may be either an ohmic contact or a forward biased Schottky barrier. The contact 50 and 52 length is typically 4 $\mu$m, while the contact width is approximately that of the related channel. The contacts 50 and 52 are typically spaced from any neighboring device elements by a gap of at least 1 $\mu$m.

Output gates 54 and 56 provide greater flexibility in optimizing the DC bias voltages. The contacts of the gates 54 and 56 have a length of approximately 1 $\mu$m, while the width is that of the channel. The contacts of the gates 54 and 56 are typically spaced from the neighboring device elements by a gap of at least 1 $\mu$m.

Figure 4:
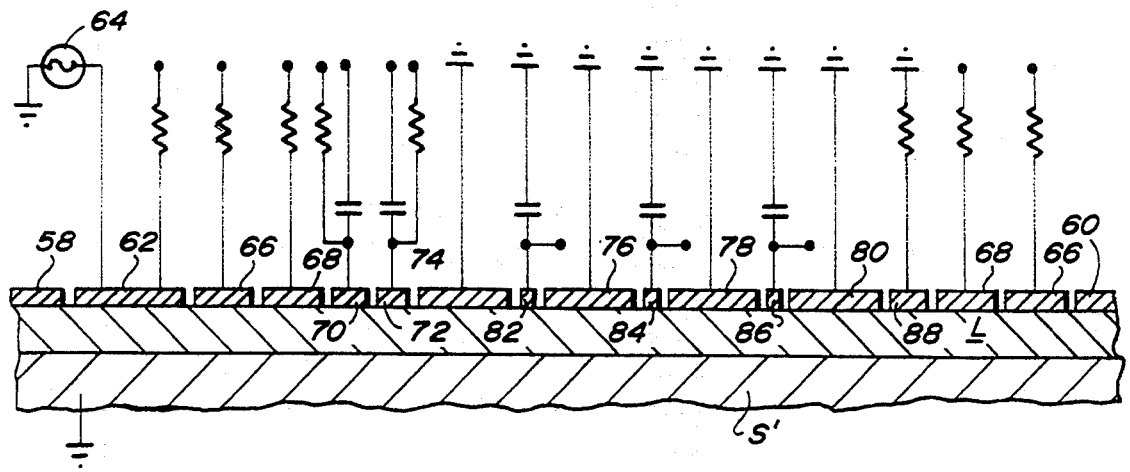
FIG. 4 is a cross-sectional view, partly in schematic, illustrating one form of an acoustic charge transport device.

FIG. 4 discloses an acoustic charge transport device as may be used in the convolver of the invention, and fabricated pursuant to the prior Pat. No. 4,633,285. Acoustic absorbers 58 and 60 are disposed at opposite ends of layer L' on the surface thereof. Transducer 62 is energized by drive system 64 and propagates a surface acoustic wave within the layer L'. A guard ring 68 may be disposed about the associated channel, and is disposed inwardly of bias ring 66, and outwardly of input contact 70 and input gate 72.

Schottky barrier elements 74, 76, 78 and 80 are disposed upon surface 44 in spaced parallel relation and extend generally transverse to the longitudinal axis of the channel. Taps 82, 84 and 86 are disposed between adjacent barrier elements and the taps non-destructively sample the propagating signal as it is transported through the channel below. The charge injected through input contact 70 is extracted as a time delayed version thereof at output 88.

Figure 2:
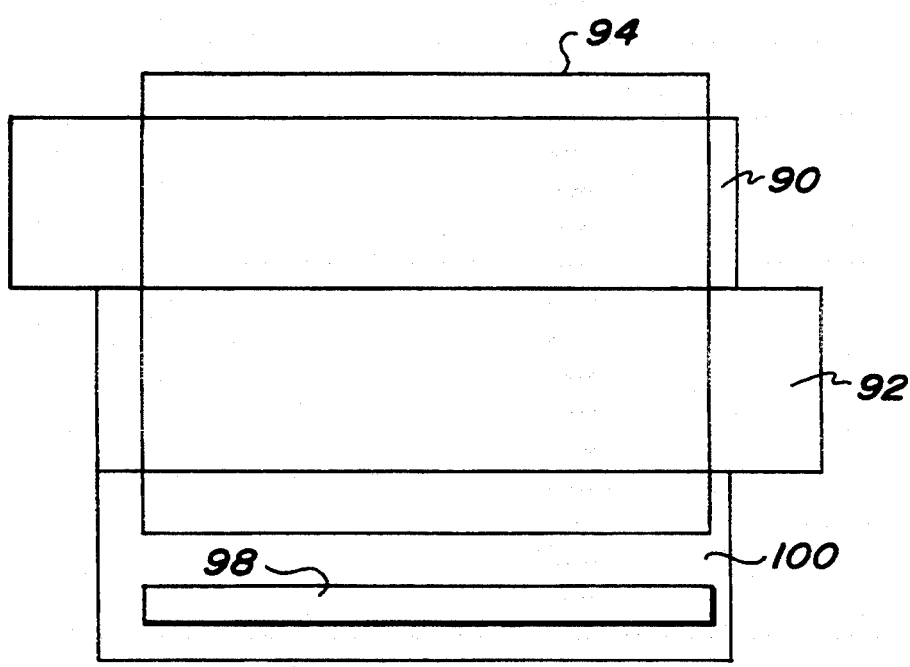
FIG. 2 is a schematic diagram illustrating the convolver of the invention.
Figure 3:
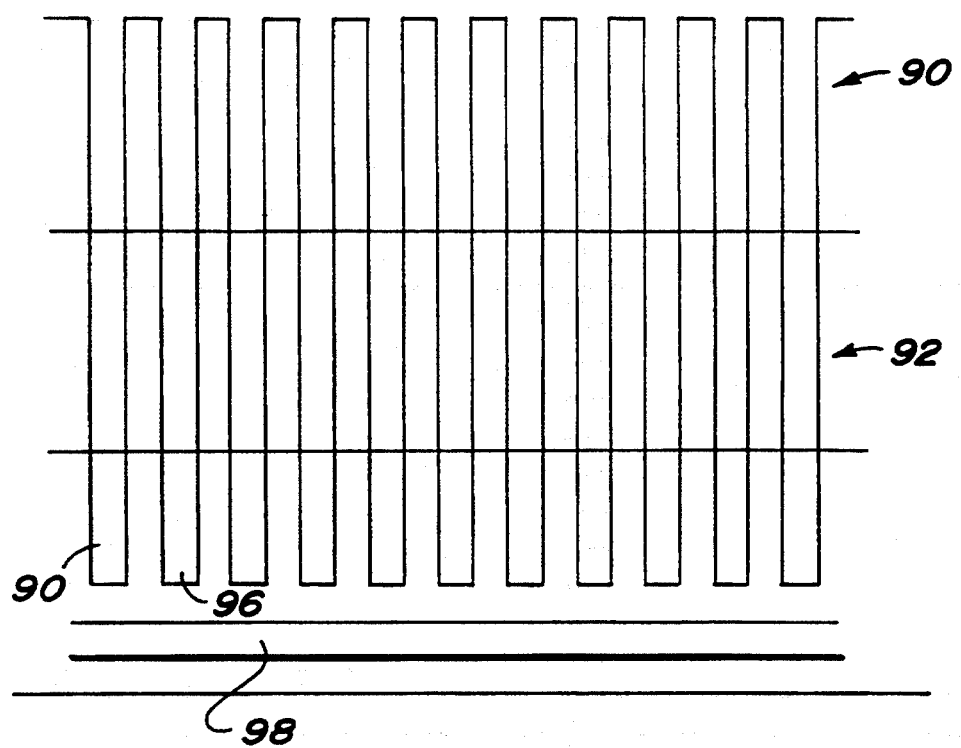
FIG. 3 is a schematic view elaborating upon the non-destructive sensing system of the invention.

FIG. 2 schematicly discloses surface acoustic wave transport channels 90 and 92 overlayed with non-destructive sensing element array 94. The array 94 comprises a plurality of metal strips 96, as best shown in FIG. 3, which are disposed in longitudinally spaced parallel relation generally transverse to the propagation axis of the channels 90 and 92. It can be noted in FIGS. 2 and 3 that the array 94 has a length exceeding the combined width of the channels 90 and 92. Each of the strips 96 terminates short of integrating electrode 98, to which the strips 96 are electrically coupled. Preferably, as best shown in FIG. 2, moat 100 extends around the electrode 98 and a portion of each strip 96 overlies the moat 100 and makes good contact with the underlying non-altered semiconductor material.

Each of the strips 96 includes metallic sensing elements 102 and 104, as best shown in FIG. 5. A bias element 106 is connected to each strip 102 and overlies the altered semiconductor portion 32. An interchannel interconnect 108 establishes electrical connection between the sensing elements 102 and 104. The interconnect 110 communicates the signal sample pairs from the sensing elements 102 and 104 to the non-linear element 112. Lastly, a ground return summing buss 114 interconnects the bias elements 106. Although only one strip 96 is illustrated in FIG. 5, those skilled in the art will understand that each of the strips 96 is essentially the same as that disclosed. Preferably, the interconnects 108 and 110, sensing elements 102 and 104, and non-linear element 112 are integral and comprised, preferably of a strip of Schottky barrier metal.

The non-linear interaction region bias elements 106 control the properties of the area within moat 39. The bias elements 106 adjust the properties within the moat 39 through application of DC potentials, and form the return path for the output signal.

The bias elements 106 are thin, preferably, titanium metal strips, and are 1 μm wide and are separated one from another by a 1 μm gap. The bias elements 106 have a length sufficient to provide high impedance at the signal frequency, 600 μm being a good example. This length provides approximately $5 \times 10^4$ for a titanium thickness of approximately 200 angstroms. This is consistent with a 360 MHz clock frequency. The minimum resistance value is substantially proportional to the inverse of the clock frequency.

The interchannel interconnects 108 perform the summing of the signal sample pairs, one element of each pair being provided by each of the two delay line channels 16 and 18, respectively.

The interconnects 110 communicate the signal sample pairs from the sensing elements 102 and 104 to the the non-linear elements 112, which preferably consist of Schottky barrier diodes. The diodes 112 are relatively short, approximately 10 to 20 μm in length, and provide optimal efficiency and bandwidth. FIG. 5 discloses the Schottky barrier depletion region 116 which is disposed within moat 39.

Output contact 98 is in ohmic contact to the underlying semiconductor material within moat 39° The contact 98 is spaced from the ends of diodes 112 by a small amount in order to avoid reachthrough of the depletion region 116 of the Schottky diodes 112. Reachthrough could cause a short circuit of the non-linear elements 112. The output contact 98 must be close enough to the diodes 112 to avoid excess series parasitic resistance due to the resistivity of the semiconductor material. A gap of 4 μm is consistent for a delay line as above outlined. The contact 98 should be designed to avoid excess series resistance along its length due to the resistivity of the contact metal. Typically, the contact 98 consists of a few hundred angstroms of a gold germanium eutectic alloy which has been alloyed to the semiconductor material by a heat treatment.

The ground return summing buss 114 provides interconnection of the bias elements 106 to a common node. The buss 114 is typically made of the same material as are the transducers 12 and 14. The buss 114 is designed to avoid excess series resistance along its length due to the resistivity of the contact metal.

DC bias voltages of the polarities shown in FIG. 6 are applied to the channel contacts 40, 42 and 50, 52 in order to deplete the channels 16 and 18 of mobile charge carriers. Typically, the buss 114 is grounded, while the delay line 16 input 40 and output 50 contacts are 4 to 10 volts positive. A positive or negative bias may also be applied to the backgate contact 118 to achieve channel depletion. A bias may also be applied to the output contact 98 in order to vary the linear and non-linear properties within the moat 39.

Figure 8:
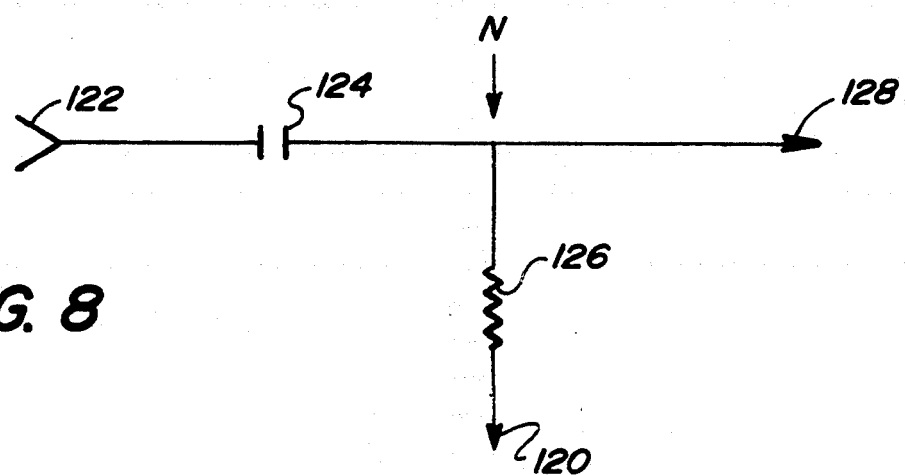
FIG. 8 is a typical interface circuit for use with the invention.

The bias voltages are applied via the network of FIG. 8. The network N has DC port 120 of very high RF impedance, thereby preventing shunting of the RF signals at the signal port 122, and providing adequate port to port isolation at the signal frequency. Preferably, the network N has a capacitance, shown as capacitor 124, of approximately 0.01 μF. The network N furthermore has a resistance, shown as resistor 126, of approximately 10KΩ. The network N has an output 128 leading to the input port of the sampling channels 16 and 18.

The epitaxially grown single crystal layer L, as best shown in FIG. 5, preferably is comprised of gallium arsenide, and has a thickness of substantially 3 μm and is doped n-type to $N_d = 2 \times 10^{15}$ cm$^{-3}$. The thickness employed must be large enough so that significant surface acoustic wave electric potential will exist in the channels 16 and 18 when the surface acoustic wave is present. The surface acoustic wave potential is at a maximum at approximately 0.4 of the acoustic wavelength employed, generally about 8 μm, and the surface acoustic wave potential decays to zero at the surface 44 and deep within the substrate S.

The dopant concentration must be high enough to permit acceptable mobile charge densities, and small enough to permit depletion of mobile carriers from the channels 16 and 18, particularly without requiring excessive generation of mobile carriers due to the thermodynamic properties of the semiconductor. Deviation from the stated dopant concentration by a factor of two would not seriously affect operation, although a deviation by a factor of 10 would. The dopant concentration along the channels 16 and 18 must be as constant as possible, typically to within 10% or less.

The backgate contact 118 is in ohmic contact to the lower surface of substrate S. Typically, the contact 118 consists of a few hundred angstroms of a gold geranium eutectic alloy which has been alloyed to the semiconductor substrate S by a heat treatment.

The non-destructive sensing array 94 includes the sensing elements 102 and 104, the bias element 106, as well as the interconnects 108 and 110 and the buss 114. The array 94 must be such that the surface acoustic wave clock is not distorted or attenuated by interaction with the strips 96. Suitable geometry is one wherein each of the sensing elements 102 and 104 is ⅛ of an acoustic wavelength in width, and each strip is separated from its nearest and parallel neighbor by ⅛ of an acoustic wavelength.

The surface acoustic waves are wider than are the channels 16 and 18 in order for the channels 16 and 18 to be uniformly illuminated. In a particular embodiment of the invention, the acoustic wavelength was 8 microns, and the sensing element 102 and 104 width and the gap width between adjacent sensing elements 102 and 104 was one micron.

The non-linear interaction region 100 of FIGS. 2 and 39 of FIG. 1 is isolated from the remainder of the device through proton bombardment of the underlying semiconductor material. The non-linear elements 112 and contact 98 are thereby situated on a moat of semiconductor material.

Those skilled in the art will understand that an output load is electrically connected to the output signal of electrode 98. The load is connected to the output contact 98 and to the buss 114 and can be configured in several ways, but in general will be resistive, capacitive, inductive, or a combination of two or all three of these.

Figure 7:
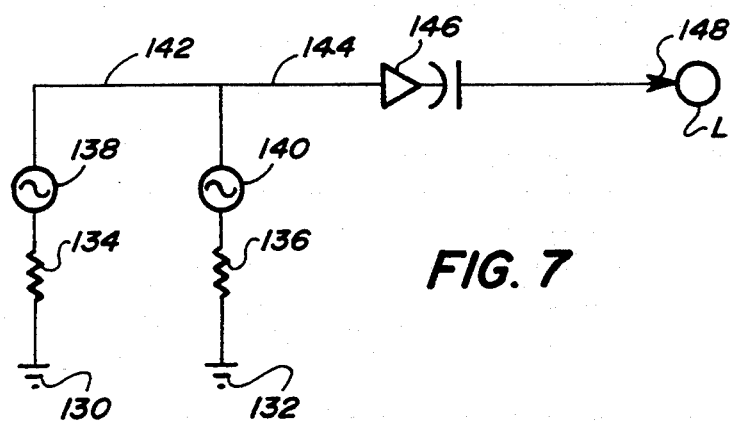
FIG. 7 is a schematic diagram of an equivalent circuit for the convolver of the invention.

FIG. 7 is a schematic diagram illustrating an equivalent circuit model of the convolver C. The grounds 130 and 132 represent the buss 114, to which the bias elements 134 and 136 are connected, and which correspond to the bias elements 106. Naturally, the delay lines 138 and 140, which correspond to the channels 16 and 18, are connected with the bias elements 134 and 136 and are in circuit connection with the interconnects 142 and 144 which communicate with non-linear element 146. The non-linear element 146 communicates with the output contact 148 and, ultimately, to the load L.

Figure 9:
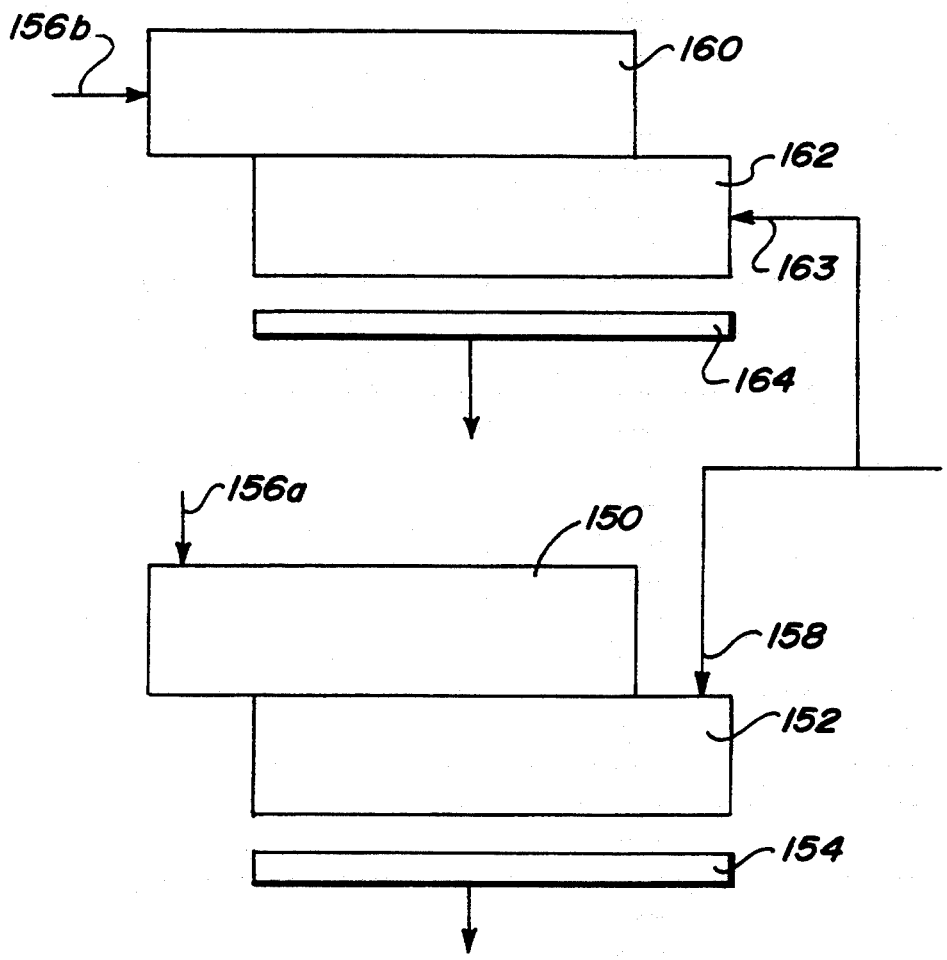
FIG. 9 is a schematic diagram illustrating a cascaded convolver system pursuant to the invention.

FIG. 9 illustrates a schematic convolver system C1 utilizing multiple convolver devices. For the sake of clarity, the non-destructive sensing array for each of the paired delay lines has been omitted, although those skilled in the art will understand that just such an array is necessary in order to perform the sampling and mixing required for signal summation.

Delay lines 150 and 152 are disposed in spaced parallel relation much as are the delay lines 16 and 18 of FIG. 1. An output contact 154 integrates the products and generates a convolution signal. Preferably, the inputs 156a and 156b of delay lines 150 and 160 are connected to known signal sources, while the inputs 158 and 163 of the delay lines 152 and 162 are connected to the signal source to be analyzed. The reference inputs 156a and 156b may be driven with separate known signal sources or connected together and driven with a single known signal source depending on the application. An output contact 164 is likewise positioned adjacent the delay lines 160 and 162 for integrating the products of the sampled signals.

A particular advantage of the embodiment of FIG. 9 is the ability to configure the device so that a plurality of signal and reference channels can be interpreted, and where each pair of signal and reference channels is connected to a unique non-linear interaction region. The signals from these individual channels can then be suitably processed and/or combined to form the desired output.

An advantage of such a cascade system is the ability to extend the available bandwidth of the delay lines to twice the Nyquist bandwidth limit of the individual delay lines. This is accomplished by relating the phase of the clock signals of the delay lines to achieve the required two samples per period of the signal wave form. In this case, the reference inputs are paralleled and driven with a single reference source. The convolver outputs are also paralleled. More elaborate schemes are also possible.

A further advantage is the elimination of strong interference signals which are banded limited. This is accomplished by band limiting the inputs to each of the delay lines in order to form a group of signal processors, each operating in a different band, such that the desired total bandwidth is split into the individual processor bandwidths. The affect of a strong interfering signal can be minimized or eliminated by electronically disconnecting the delay lines in which the strong signal dominates.

The dynamic range of the composite system C1 can be extended by band limiting each of the individual channels. The undesired mixing products formed in each channel can be discriminated against by means of suitable spatial or frequency domain filters. The outputs from each processor can then be recombined to regain the full desired signal processing bandwidth.

The load L can be chosen to have impedance properties which, in conjunction with the impedance properties of the non-linear interaction region 100, non-destructive array 94, and the non-linear interaction region bias elements 100, determine the frequency dependence of the output signal amplitude and phase.

The use of capacitive non-linear interaction region bias elements and a resistive load can be employed to result in compensation of the non-destructive sensing array 94 frequency dependence by an appropriate choice of the various element values. The principle employed is to create a high-pass RC filter which has its 3 dB frequency greater than the highest desired output frequency. The high pass RC circuit response tends to compensate the non-destructive sensing array response which diminishes with increasing frequency.

Alternatively, a similar affect can be achieved by applying a capacitive load, such as the gate of an FET, and employing resistive non-linear interaction region bias elements. The use of capacitive elements and load functions results in minimum phase distortion, while maintaining the frequency dependence of the process.

Spatial filtering of the input signals via modification of the geometry of the non-destructive sensing array 94 can be achieved. This filtering can be different for the two delay lines, in contrast to the prior art where the use of a single delay line for both wave forms required that the spatial filtering of both the signal and reference wave forms be identical.

Spatial filtering of the signals in the non-linear interaction region 100, independent of the spatial filtering of the input signals via the non-destructive sensing array 94, is possible. This can be effected by suitable modification of the output contact 98 and of the geometry of the non-destructive sensing array 94, or by modification of the non-linear interaction region bias elements 106.

ESTABLISHMENT OF ACOUSTIC CHARGE TRANSPORT DELAY LINE OPERATION

The DC bias conditions necessary for the delay line 16 and 18 requires that the channels be depleted of mobile carriers. This is accomplished by means of the DC voltage supplies 166, 168 and 118, as best shown in FIG. 6. The sensing elements 102 and 104 are reverse biased Schottky contacts to the semiconductor channels 16 and 18.

Electrical energy is supplied to the transducers 12 and 14 by the drive system 24, at both a frequency and a power level which are consistent with generation of a powerful surface acoustic wave. The power level of the surface acoustic wave must be such that the electrical potential magnitude of the surface acoustic wave at the depth at which acoustic charge transport occurs is significantly greater than the thermal energy of the electrons.

The surface acoustic wave propagates from the transducers 12 and 14 past the associated input contacts 40 and 42 and through the channels 16 and 18. Then the wave propagates beyond the output contacts 50 and 52, and is finally converted into heat, preferably by interaction with an acoustic absorber. The reverse wave generated by the transducers 12 and 14 is reflected by the reflectors 20 and 22, and then follows the above path.

A small and controlled number of electrons are injected into the transport channels 16 and 18 by the DC bias voltage 166 applied to the input contacts 40 and 42.

The quantity of injected electrons is directly proportional to the DC voltage on the input contacts 40 and 42. These electrons are bunched, and form discrete charge packets, and are transported within the electrical potential of the powerful surface acoustic wave.

The injected charge travels at the surface acoustic wave velocity within the channels 16 and 18, until the charge reaches the associated output contacts 50 and 52. The large positive potential of the output contacts 50 and 52, due to the applied voltage of bias 168, causes the charge to be extracted from the channels 16 and 18.

A backgate bias may be applied through contact 118 to insure that the electrical potential minimum within the channels 16 and 18, due to the depletion of the mobile carriers, occurs at a depth below the epilayer L surface which is coincident or nearly coincident with the maximum of the electrical potential associated with the surface acoustic wave. The effective amplitude of the surface acoustic wave clock is reduced if these potentials are not coincident. If the potentials are grossly non-coincident, then the device will not be operative.

The above noted embodiment utilized a clock which had an 8 $\mu$m wavelength. The maximum amplitude of the surface acoustic wave electrical potential occurred at approximately 3.2 $\mu$m. Deviation of the depletion potential minimum from this depth by more than a micron will result in somewhat degraded performance, with the degree of degradation being related to the degree of deviation. The input contacts 40 and 42 are less positive than the output contacts 50 and 52 by one to several volts. This permits a small amount of electrons to be injected by the input contacts 40 and 42, while the output contacts 50 and 52 will exclusively extract electrons.

The DC bias conditions thus establish a steady state flow of electron packets of a uniform number of electrons from the input contacts 40 and 42 to the output contacts 50 and 52 through the channels 16 and 18 at the velocity of the surface acoustic wave. The particular electrons in any one packet remain in that particular packet throughout this traverse.

Electrons are injected into the sem-conductor channels 16 and 18 by the RF signal and DC bias voltages applied to the input contacts 40 and 42 and the input gates 46 and 48. The number of electrons injected is directly proportional to the instantaneous voltage on the input contacts 40 and 42. These electrons, as noted, are bunched into discrete packets of charge and are transported within the electrical potential of the powerful surface acoustic wave. The high frequency surface acoustic wave is thus the sampling clock of the delay lines 16 and 18.

The injected charge within the channels 16 and 18 capacitively couples to the elements 102 and 104, thereby giving rise to an image charge, and thus a voltage on the sensing elements 102 and 104.

These charge and voltage quantities are proportional to the magnitude of the charge under the particular sensing element 102 and 104 at that point in time. The result of this process is that each sensing element 102 and 104 will, in turn, manifest a delayed replica of the input signal of the associated channel, without perturbing the signal charge within the associated channel.

CONVOLVER OPERATION

Operation of the convolver C of FIG. 1 is relatively straightforward when the input contact 40 is fed a signal from signal input 170. A reference signal input to input contact 42 is fed from reference input 172. As previously explained, charge, which is representative of the signal at any given time, is injected into the channels 16 and 18 and is transported by the respective surface acoustic waves to the associated outputs 50 and 52.

Point by point sampling of the input signals occurs as the image charge is impressed onto the sensing elements 102 and 104 overlying the channels 16 and 18, respectively. Naturally, each of the plural sensing elements 102 and 104 samples the charge underlying it at any given point in time. The samples of the channel 16 are individually summed with the samples of the channel 18 by the electrical interconnection provided by the inter-channel interconnects 108. The sums are then communicated to the non-linear elements 112 by the non-linear interaction region interconnects 110. The non-linear element forms the point by point products of the sums of the signal sample pairs.

The output contact 98 integrates the signal sample pairs and their products along the length of the delay lines 16 and 18, thereby forming the convolution of the signals in the two delay lines 16 and 18.

The output circuit is completed by connection of the bias element 106 and the buss 114 to the load. As noted, an equivalent circuit model is shown in FIG. 7.

Should one signal be the time reversed replica of the other, then the products of the signal sample pair sums have phases which are invariant along the length of the delay lines 16 and 18, and in that case that integration results in a large signal amplitude at the output contact 98.

Should the signal sample pairs not have phases which are invariant along the length of the delay lines 16 and 18, then the integration of the signal samples themselves gives rise to a zero or near zero contribution to the output signal. Similarly, the higher order mixing product of the signal samples and their signal sample sum have phases which vary rapidly along the device length, so that the integration of these contributions results in zero or near zero contribution to the output signal. Naturally, the degree to which the desired output signal dominates over the unwanted contribution is a function of the number of sensing elements 102 and 104 employed.

Those skilled in the art will understand that the use of acoustic charge transport delay line technology, such as that provided by the channels 16 and 18, provides convolution efficiencies (defined as the output signal power divided by the product of the input signal powers) which are many orders of magnitude greater than can be achieved with conventional surface acoustic wave delay line approaches. This results primarily from the high efficiency of the mixing operation provided by the semiconductor non-linear elements. Another improvement results from a fundamental difference in the sensing mechanism appropriate for each. In the conventional case, each sample of the stored signal represents energy which has been extracted from the original sample. In the disclosed invention, on the other hand, the energy in each sample is derived from the clock drive signal which moves the charge representative of the input signal. This clock drive signal induces motion of an image charge in the top surface metalization and it is the image charge which is detected as the signal sample. The original charge, input through the input contact, is not affected by the process.

The fundamental differences between the conventional technologies and the disclosed invention results in extremely high efficiency in converting input energy into the desired convolution product. The differences are so substantial that the disclosed invention is actually capable of gain, in strong contrast to the conventional technologies which are limited to substantial losses. Also, the use of acoustic charge transport delay line elements in a convolver permits the fractional bandwidth and dynamic range of the convolver to be extended beyond the limits imposed with conventional surface acoustic wave technology.

While this invention has been described as having a preferred design, it is understood that it is capable of further modifications, uses and/or adaptations of the invention following in general the principle of the invention and including such departures from the present disclosure as come within known or customary practice in the art to which the invention pertains, and as may be applied to the central features hereinbefore set forth, and fall within the scope of the invention of the limits of the appended claims.

What we claim is:

1. A convolver, comprising:
   a) first and second buried channels, each of said channels comprised of a piezoelectric semiconductor;
   b) each channel has a signal input and a signal output, the input of one channel being spatially associated with the output of the other channel;
   c) transducer means operably associated with each of said inputs for generating an acoustic wave which propagates through the associated channel and transports charge representative of an input signal from the input to the output thereof, and the wave of one channel propagates in a direction opposite to the direction in which the wave of the other channel propagates;
   d) a plurality of sensing means overlying each channel for sampling the charge transported thereunder;
   e) means operably associating each sensing means of one channel with an associated sensing means of the other channel for combining the sensed charges thereof and for generating a product; and,
   f) means operably associated with said combining means for integrating the products and generating a convolution signal.

2. The convolver of claim 1, wherein:
   a) each of said sensing means includes a conductive strip disposed generally transverse to the associated channel; and,
   b) the strips of each channel being spaced apart and disposed generally parallel.

3. The convolver of claim 2, wherein:
   a) said channels disposed in parallel relation; and,
   b) each strip of one channel being in longitudinal alignment with its associated strip of the other channel.

4. The convolver of claim 3, wherein:
   a) a plurality of conductive interconnecting means interconnecting one strip of a channnel with its associated strip of the other channel.

5. The convolver of claim 4, wherein:
   a) said strips, interconnecting means and sampling means being integral and comprised of a metal and providing a plurality of sensing elements.

6. The convolver of claim 5, wherein:
   a) each of said sensing elements has a first end and a second end, each of said ends being associated with and spaced from one of said channels; and,
   b) each of one of said ends being operably interconnected and forming a buss.

7. The convolver of claim 6, wherein:
   a) said summing means including a non-linear element associated with said non-interconnected ends; and,
   b) an output electrode being spaced from said non-interconnected ends for integrating the products.

8. The convolver of claim 7, wherein:
   a) each of said non-linear elements including a diode; and,
   b) said electrode extends generally transverse to said sensing elements.

9. The convolver of claim 1, wherein:
   a) first insulating means defining each of said channels and comprised of a material permitting acoustic energy to flow therethrough and substantially preventing electric energy from flowing therethrough; and,
   b) second insulating means bounding said integrating means and defining a non-linear interaction region which is overlayed by a portion of said summing means.

10. The convolver of claim 9, wherein:
    a) said insulating means includes proton bombarded portions of said piezoelectric semiconductor.

11. The convolver of claim 1, further comprising:
    a) first and second reflector means, each of said reflector means associated with one of said transducer means; and,
    b) each of said transducer means disposed intermediate the associated channel input and reflector means.

12. The convolver of claim 1, further comprising:
    a) a common substrate of piezoelectric semiconductor material;
    b) said channels being disposed in said substrate in spaced parallel relation; and,
    c) said inputs, outputs, transducer means, sensing, combining and integrating means being disposed on a surface of said substrate.

13. The convolver of claim 1, further comprising:
    a) third and fourth buried channels, each of said third and fourth channels comprised of a piezoelectric semiconductor;
    b) each of said third and fourth channels has an input and an output;
    c) second transducer means operably associated with each of said third and fourth channels for generating an acoustic wave which propagates through the associated channels and transports charge from the input to the output thereof;
    d) a plurality of second sensing means overlying said third and fourth channels for sampling the charge transported thereunder;
    e) second means operably associating each sensing means of one of said third and fourth channels with an associated sensing means of the other of said third and fourth channels for combining the charge sample signals and for generating a product;
    f) second means operably associated with said second combining means for integrating the products thereof and for generating a convolution signal.

14. An integrated device, comprising:
    a) a substrate comprised of a piezoelectric semiconductor;
    b) insulating means disposed within said substrate and defining spaced parallel first and second channels, said channels being generally rectangular and having first and second ends;
c) a first signal input operably associated with said first channel first end and a second signal input operably associated with said second channel second end;
d) a first signal output operably associated with said first channel second end and a second signal output operably associated with said second channel first end;
e) a first transducer operably associated with said first input and a second transducer operably associated with said second input, each transducer generating an acoustic wave propagating through the associated channel for transporting charge representative of an input signal from the input to the output thereof and the wave of one channel propagating in a direction opposite to the direction in which the wave of the other channel propagates;
f) plurality of sensing means overlying said channels, each sensing means sampling the charge transported thereunder by the associated wave and mixing the sampled charge of one channel with the sampled charge of the other channel and thereby generating a product; and,
g) means operably associated with said sensing means for integrating the products thereof and generating a convolution signal.

15. The device of claim 14, wherein:
a) said insulating means defining a non-linear interaction region within said substrate, said region disposed generally parallel to and spaced from said second channel;
b) said integrating means disposed within said region; and,
c) said insulating means being provided by proton bombardment of selected portions of said substrate.

16. The device of claim 15, wherein:
a) each of said sensing means including a non-linear portion extending into and being closely spaced from said integrating means.

17. The device of claim 16, wherein:
a) each of said non-linear portions is a Schottky barrier diode; and,
b) said integrating means is an electrode in ohmic contact with said substrate.

18. The device of claim 16, wherein:
a) each of said sensing means extending generally transverse to the associated channel, and said sensing means being disposed in spaced parallel relation; and,
b) each of said sensing means comprised of a conductive material.

19. The device of claim 18, wherein:
a) each of said sensing means having first and second end portions, each of said end portions associated with and disposed laterally beyond one of said channels;
b) said second end portion associated with said integrating means;
c) the substrate beneath said second end portions including a Schottky barrier depletion region; and,
d) said first end portions being operably interconnected and forming a buss.

20. The device of claim 14, further comprising:
a) first and second acoustic reflectors, each of said transducers disposed intermediate one of said reflectors and the associated channel for increasing transducer efficiency.

21. The device of claim 14, wherein:
a) each of said inputs includes a metallic strip in ohmic contact with said substrate; and,
b) each of said output contacts includes a metallic strip in contact with said substrate.

22. A convolver, comprising:
a) first and second acoustic charge transport devices, each device has an input through which charge is injected and an output through which injected charge transported from the input by an acoustic wave propagating through the device is extracted, said first device input is associated with said second device output and the wave of one device propagates in a direction opposite to the direction in which the wave of the other device propagates;
b) a plurality of non-destructive sensing means overlies said devices, each sensing means sampling the charge transported thereunder by the associated wave and mixing the charge sampled at one device with the charge sampled at the other device and thereby generating a plurality of products; and,
c) means operably associated with said sensing means for integrating the products thereof and generating a convolution signal.

23. The convolver of claim 22, wherein:
a) each of said sensing means includes a non-linear element for mixing the sampled charges and a conductive strip in connection therewith for transmitting the sampled charge to said element.

24. The convolver of claim 23, wherein:
a) each of said non-linear elements is a diode.

25. The convolver of claim 22, wherein:
a) each of said sensing means is disposed generally transverse to the associated device and has a first end portion disposed beyond said first device and a second end portion disposed beyond said second device, said first end portions being interconnected and forming a buss.

26. The device of claim 25, wherein:
a) said integrating means includes an output contact; and,
b) said second end portions include diodes spaced sufficiently close to said output contact to permit the product to be transmitted thereto.

27. The convolver of claim 26, wherein:
a) said devices being integrated onto a common substrate;
b) each of said sensing means includes a Schottky barrier diode; and,
c) insulating means are disposed about said output contact and define a non-linear interaction region in which at least a portion of each diode is disposed.

28. The convolver of claim 27, wherein:
a) said substrate is gallium arsenide; and,
b) said sensing means each includes a metallic strip.

29. The convolver of claim 27, wherein:
a) a transducer is operably associated with each device for generating the surface acoustic wave which propagates through the buried channel of each device, each transducer being integrated onto said substrate; and,
b) an acoustic reflector is operably associated with each transducer for increasing the efficiency thereof.

30. A method of generating a convolution signal, comprising the steps of:
 a) providing first and second buried channels, each channel comprised of a piezoelectric semiconductor and the input of one channel being associated with the output of the other channel;
 b) propagating an acoustic wave through each channel and thereby transporting injected charge from the associated input to the associated output, one of said inputs connected to a known signal source and the other of said inputs connected to an unknown signal source and the wave of one channel propagating in a direction opposite to the direction in which the wave of the other channel propagates;
 c) sampling the charge transported through each channel by the associated wave with a number of sampling means spaced along each channel;
 d) generating a plurality of products by mixing the charge sampled with each sampling means of one channel with the charge sampled with the associated sampling means of the other channel; and,
 e) generating a convolution signal by integrating the products.

31. The method of claim 30, including the steps of:
 a) mixing the sampled charges through the cooperative action of a plurality of non-linear elements; and,
 b) integrating the products through the operation of an output contact.

32. The method of claim 31, including the steps of:
 a) disposing said channels in spaced parallel relation;
 b) positioning said contact parallel to said channel;
 c) disposing said sampling means in spaced parallel relation disposed generally transverse to said channels; and,
 d) spatially filtering the input signals.

33. The method of claim 32, including the steps of:
 a) integrating said channels onto a common substrate; and,
 b) insulating said channels from each other by insulating means permitting free flow of acoustic energy therethrough and substantially preventing flow of electrical energy therethrough.

34. The method of claim 33, including the steps of:
 a) establishing an insulating moat around said contact;
 b) providing Schottky barrier diodes as said non-linear elements, each of said diodes having a portion disposed within said moat; and,
 c) spatially filtering the signals within said moat.

35. A convolution method, comprising the steps of:
 a) providing first and second acoustic charge transport devices, said devices integrated onto a common piezoelectric semiconductor substrate and being disposed in spaced parallel relation, the input of one device being associated with the output of the other device;
 b) injecting a known signal into the input of one device and injecting an unknown signal into the input of the other device;
 c) transporting the injected signals through the associated devices by means of an acoustic wave propagating through each device, the wave of one device propagating oppositely to the wave of the other device;
 d) sampling the injected signals through a plurality of non-destructive sensing means spaced along each of said devices;
 e) generating a product by mixing the sampled signal of each sensing means of one channel with the sampled signal of an associated sensing means of the other channel;
 f) generating a convolution signal by integrating the products.

36. The method of claim 35, including the steps of:
 a) integrally interconnecting each sensing means of one channel with its associated sensing means of the other channel;
 b) mixing the signals through the operation of a plurality of non-linear elements, each element being integral with an associated sensing means.

37. The method of claim 36, including the steps of:
 a) electrically isolating one device from the other by proton bombardment of selected portions of said substrate;
 b) defining a moat disposed parallel to said devices and positioning an integrating means within said moat; and,
 c) at least a portion of said non-linear elements extending into said moat but terminating short of said integrating means.

38. The method of claim 37, including the steps of:
 a) providing Schottky barrier diodes as said non-linear elements; and,
 b) providing an output contact as said integrating means, said output contact extending parallel to said devices.

* * * * *